(12) United States Patent
Li

(10) Patent No.: US 6,301,031 B2
(45) Date of Patent: *Oct. 9, 2001

(54) METHOD AND APPARATUS FOR WAVELENGTH-CHANNEL TRACKING AND ALIGNMENT WITHIN AN OPTICAL COMMUNICATIONS SYSTEM

(75) Inventor: Yuan P. Li, Duluth, GA (US)

(73) Assignee: Agere Systems Optoelectronics Guardian Corp., Orlando, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/921,911

(22) Filed: Sep. 2, 1997

(51) Int. Cl.[7] .................................................... H04J 14/02
(52) U.S. Cl. ........................... 359/124; 359/125; 359/127; 359/130; 359/187; 359/133
(58) Field of Search .................................. 359/124, 125, 359/127, 130, 187, 133

(56) References Cited

U.S. PATENT DOCUMENTS

| | | | |
|---|---|---|---|
| 5,002,350 | 3/1991 | Dragone | 359/124 |
| 5,136,671 | 8/1992 | Dragone | 385/46 |
| 5,311,347 * | 5/1994 | Kubo et al. | 359/176 |
| 5,387,992 * | 2/1995 | Miyazaki et al. | 359/124 |
| 5,396,360 * | 3/1995 | Majima | 359/133 |
| 5,493,625 * | 2/1996 | Glance | 385/24 |
| 5,532,865 * | 7/1996 | Utsumi et al. | 359/189 |
| 5,539,560 * | 7/1996 | Dennis et al. | 359/128 |
| 5,663,823 * | 9/1997 | Suzuki | 359/181 |
| 5,778,118 * | 12/1998 | Sridhar | 385/241 |
| 5,850,302 * | 12/1998 | Strasser et al. | 359/127 |
| 5,861,975 * | 1/1999 | Sakuyama et al. | 359/187 |
| 5,864,423 * | 1/1999 | Kosaka | 359/341 |
| 5,886,802 * | 3/1999 | Majima | 359/124 |
| 5,920,414 * | 7/1999 | Miyachi et al. | 359/133 |
| 5,943,152 * | 8/1999 | Mirahi et al. | 359/187 |
| 5,949,562 * | 9/1999 | Kubota et al. | 359/124 |
| 6,031,644 * | 2/2000 | Utsumi | 359/110 |
| 6,031,647 * | 2/2000 | Roberts | 359/161 |
| 6,061,157 * | 5/2000 | Terahara | 359/124 |
| 6,069,719 * | 5/2000 | Mizrahi | 359/124 |
| 6,134,034 * | 10/2000 | Terhara | 357/124 |
| 6,134,036 * | 10/2000 | Andreozzi et al. | 359/127 |

OTHER PUBLICATIONS

"Optical FDM Transmission Technique" by Nosu et al, IEEE, p. 1305, Fig. 10, 1987.*

Nosu et al., publication "Optical FDM Transmission Technique", p. 1305, 1987 IEEE.*

* cited by examiner

*Primary Examiner*—Leslie Pascal
*Assistant Examiner*—Hanh Phan

(57) ABSTRACT

The present invention teaches a novel technique for properly aligning the various channel positions of an optical signal splitter/combiner device, such as a DWDM, and associated optical transmitter(s), often a laser. In particular, the described technique establishes and utilizes feedback links between the operating temperature of the splitter/combiner and the operating temperature or operating current of the transmitter(s) to accurately manipulate the wavelengths of these devices in a manner that results in accurate alignment of the device wavelengths to the desired grid of channel positions, $\lambda_0, \lambda_1, \lambda_2, \lambda_3, \ldots, \lambda_n$. Furthermore, by providing this active alignment or tracking scheme, the techniques of the present invention allows optical systems to more effectively operate at smaller channel spacings, i.e. $\leq$ about 50 GHz between adjacent channel positions, and with larger number of channels per device, i.e. $\geq$ about 32 channels.

21 Claims, 3 Drawing Sheets

POINT-TO-POINT SYSTEM

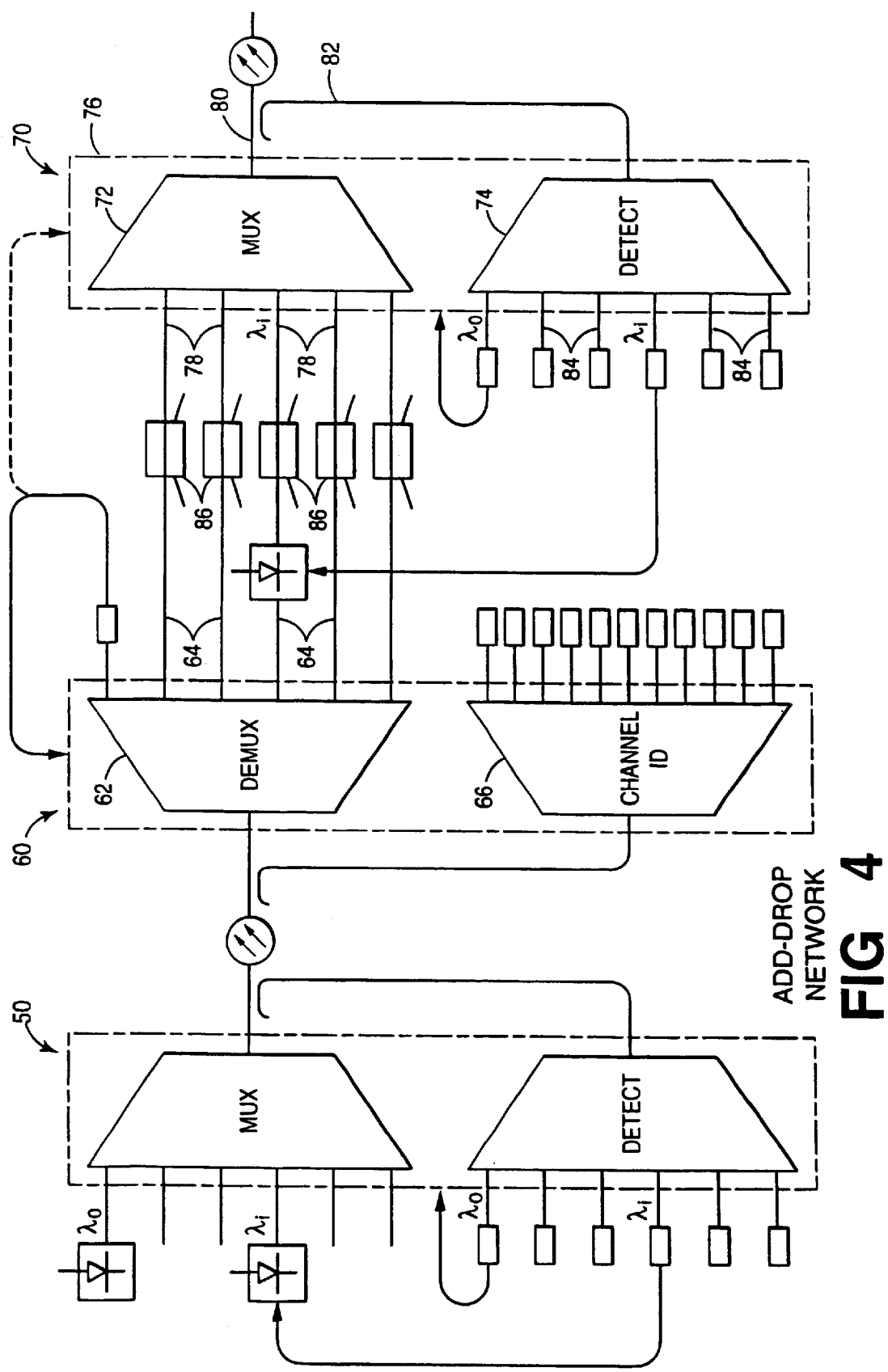

METHOD AND APPARATUS FOR WAVELENGTH-CHANNEL TRACKING AND ALIGNMENT WITHIN AN OPTICAL COMMUNICATIONS SYSTEM

TECHNICAL FIELD

This invention relates to optical communication systems which incorporate wavelength division multiplexing, and demultiplexing functions. More particularly, this invention relates to an optical interconnection apparatus for use within such communication systems that has improved wavelength-channel tracking and alignment capabilities.

BACKGROUND OF THE INVENTION

As generally depicted in FIG. 1, optical wavelength multiplexing and demultiplexing have been accomplished in the past by using an interconnection apparatus having a plurality of closely spaced input waveguides 2 communicating with the input of a star coupler 4. The output of the star coupler 4 communicates with an optical grating 6 comprising a series of optical waveguides, each of the waveguides differing in length with respect to its nearest neighbor by a predetermined amount. The grating 6 is connected to the input of a second star coupler 8, the outputs 9 of which form the outputs of the switching, multiplexing, and demultiplexing apparatus. Examples of such interconnection apparatuses are disclosed in U.S. Patents 5,002,350 and 5,136,671, which are expressly incorporated by reference herein.

The overall design, and particularly the geometry, of such an interconnection apparatus may be such that a plurality of separate and distinct wavelengths each launched into a separate and distinct input port of the apparatus will all combine and appear on a predetermined one of the output ports. In this manner, the apparatus performs a multiplexing function. A similar apparatus may also perform a demultiplexing function. In this situation, an input wavelength is separated from the others and directed to a predetermined one of the output ports of the apparatus. An appropriate selection of input wavelength also permits switching between any selected input port to any selected output port. Accordingly, these devices are generally referred to as frequency routing devices and more specifically wavelength division multiplexers (WDM).

Ideally, the individual wavelength-channel positions, as measured by the center point of the passband, of the WDMs and the associated transmitter(s) should be aligned to a predefined wavelength grid, referenced herein as $\lambda_0, \lambda_1, \lambda_2, \lambda_3, \ldots, \lambda_n$. Unfortunately however, in practice, the wavelengths of both the transmitter(s) and WDM channels drift with time and/or have initial fabrication errors. Such drifting or fabrication errors each result in the wavelengths of the respective optical devices to not be aligned as desired and thus adversely affect the operation of that device within a communication system. At present, either fabrication error and/or variances during operation can cause WDM components themselves to often exhibit about a 0.1 nm or 10 GHz shift or tolerance within a 100 GHz system while a transmitter may often exhibit about twice that amount of offset or about 20 GHz in a 100 GHz system. Furthermore, to be effectively used in the increasingly demanding optical communication systems of today where WDM systems are going to smaller channel spacings, i.e., less than about 50 GHz, and large channel counts, i.e. greater than or equal to about 32 channels, improvement is needed in the ability to provide appropriate wavelength-channel tracking and alignment in a WDM system and integrated device.

To date, devices have typically used what may be referred to as a "set and forget" scheme. In other words, existing devices have simply relied on the passband width of the WDM and/or transmitter(s) being large enough to tolerate any and all of the wavelength inaccuracies that may be present due to at least the reasons set forth above. In such a system, the wide WDM passband requires large channel spacing and also significantly limits the number of channels that can be effectively used in that communication system.

SUMMARY OF THE INVENTION

The present invention relates to an optical apparatus that has improved wavelength-channel tracking and alignment capabilities. More specifically, an optical apparatus includes an optical splitter/combiner device which receives optical signals. At least some portion of the optical signals from an output of the splitter/combiner is tapped or diverted into a detecting device which includes a wavelength selective device and has a detector connected to at least one of its outputs. The detector evaluates at least one selected characteristic about the optical signal on a predetermined channel and cooperates with a feedback link between the evaluated signal channel to controllably affect the selected characteristic for at least one of the optical signals received into the optical apparatus.

Alternative embodiments of the present invention incorporate optical devices having the improved wavelength-channel tracking and alignment capabilities into various components of any well known type of communications system such as a point-to-point communications system and/or Add-Drop optical networks.

BRIEF DESCRIPTION OF THE DRAWINGS

Other features of the present invention will be more readily understood from the following detailed description of specific embodiments thereof when read in conjunction with the accompanying drawings, in which:

FIG. 4 is an Add-Drop communications system employing an embodiment of the present invention.

DETAILED DESCRIPTION

The present invention teaches a novel technique for properly aligning the various channel positions of either an optical signal splitter/combiner, such as a WDM, and/or the associated optical transmitter(s), often one or more lasers. In particular, the described technique establishes and utilizes feedback links between an operational characteristic, such as the operating temperature, of the splitter/combiner and/or the transmitter(s) to accurately manipulate the wavelengths of these devices in a manner that results in accurate alignment of the wavelengths of the optical device(s) to the desired grid of channel positions, $\lambda_0, \lambda_1, \lambda_2, \lambda_3, \ldots, \lambda_n$. One basis of the present invention is the well known principle that the refractive index of a material used within an optical device and/or the geometrical demensions of that device may change due to temperature variations.

In accordance with one embodiment of the present invention, there are two different sets of wavelengths that should be accurately aligned with the desired grid of channel positions, $\lambda_0, \lambda_1, \lambda_2, \lambda_3, \ldots \lambda_n$. First, the passbands for each of the channels, designated herein as $\lambda_{0WDM}, \lambda_{1WDM}, \lambda_{2WDM}, \lambda_{3WDM}, \ldots, \lambda_{nWDM}$, of the optical signal splitter/combiner needs to be aligned so that $\lambda_{0WDM}$ corresponds to $\lambda_0$, $\lambda_{1WDM}$ corresponds to $\lambda_1$, $\lambda_{2WDM}$ corresponds to $\lambda_2$, etc. Based on present manufacturing capabilities, while the separation or spacing between the passbands for each of the channels within the optical signal splitter/combiner is relatively consistent, often the alignment does not directly correspond to the desired grid of channel positions, $\lambda_0, \lambda_1, \lambda_2, \lambda_3, \ldots, \lambda_n$. In this regard, the present invention provides a technique to collectively shift the passbands of all wavelength channels to the more desirable position.

Secondly, the individual transmitter(s) used to initiate the plurality of optical signals, designated herein as $\lambda_{1LAS}, \lambda_{2LAS}, \lambda_{3LAS}, \ldots, \lambda_{nLAS}$, launched into the various channels of the splitter/combiner are not always manufactured to directly correspond to the desired grid of channel positions, $\lambda_1, \lambda_2, \lambda_3, \ldots, \lambda_n$. The present invention provides the capability to individually detect the wavelength of each of the transmitted signals and adjust them to their most efficient position. In other words, where k1LAS corresponds to $\lambda_1$, $\lambda_{2LAS}$ corresponds to $\lambda_2$, etc.

Figure 2:
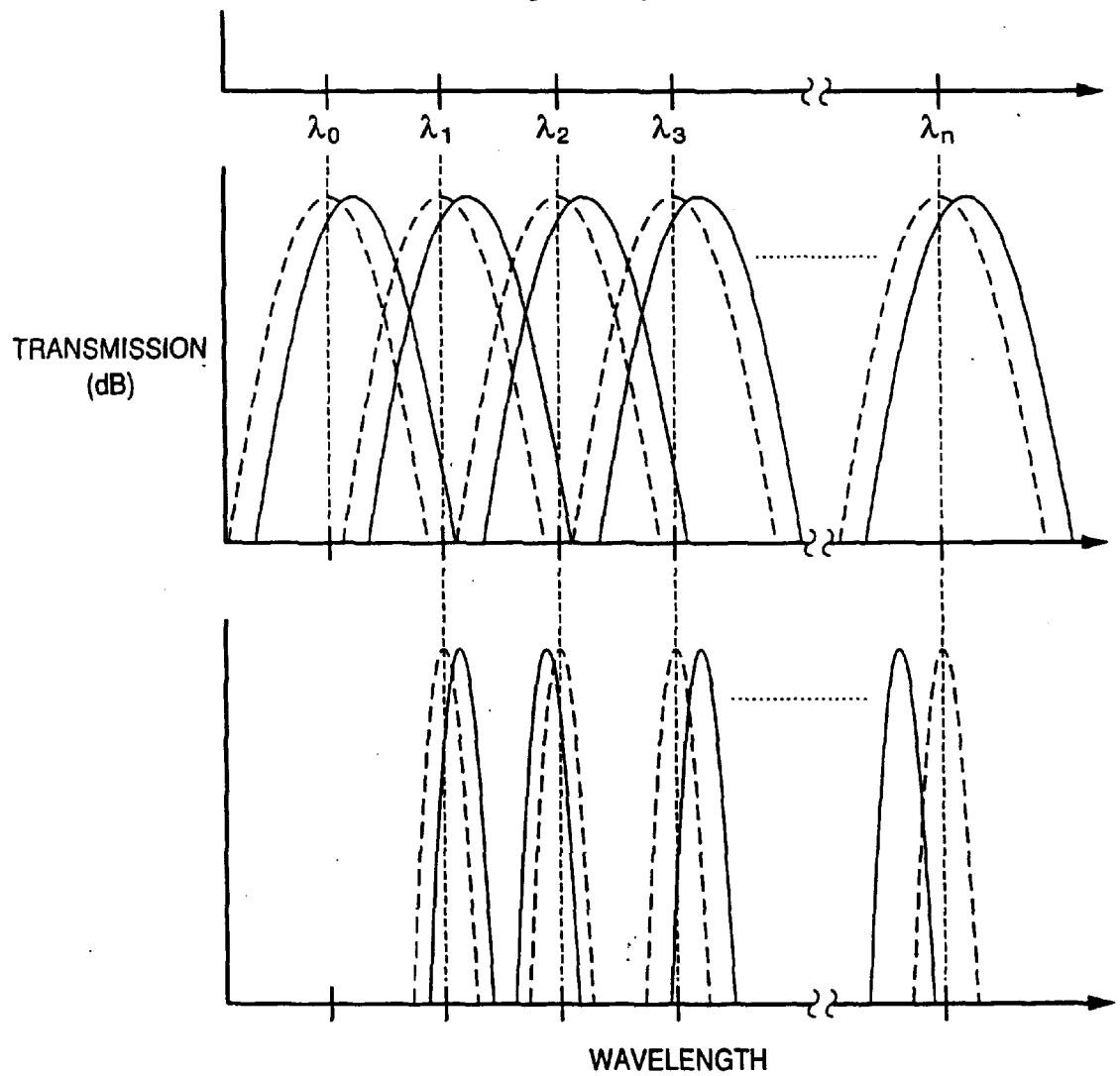
FIG. 2 graphically depicts undesirable initial wavelength positions, solid lines, as compared to the desired positioning, dotted lines, for both the splitter/combiner and the individual transmitters.

To illustrate what is generally described above, FIG. 2 graphically depicts undesirable initial wavelength positions, solid lines, as compared to the desired positioning, dotted lines, for both the splitter/combiner and the individual transmitters. More specifically, the top horizontal axis establishes the desired grid of channel positions, $\lambda_0, \lambda_1, \lambda_2, \lambda_3, \ldots, \lambda_n$, the second horizontal axis depicts the pass bands of the various channels of the splitter/combiner $\lambda_{0WDM}, \lambda_{1WDM}, \lambda_{2WDM}, \lambda_{3WDM}, \ldots, \lambda_{nWDM}$, while the third horizontal axis depicts the individual wavelengths of the signals generated by the transmitter(s) $\lambda_{1LAS}, \lambda_{2LAS}, \lambda_{3LAS}, \ldots, \lambda_{nLAS}$.

Figure 3:
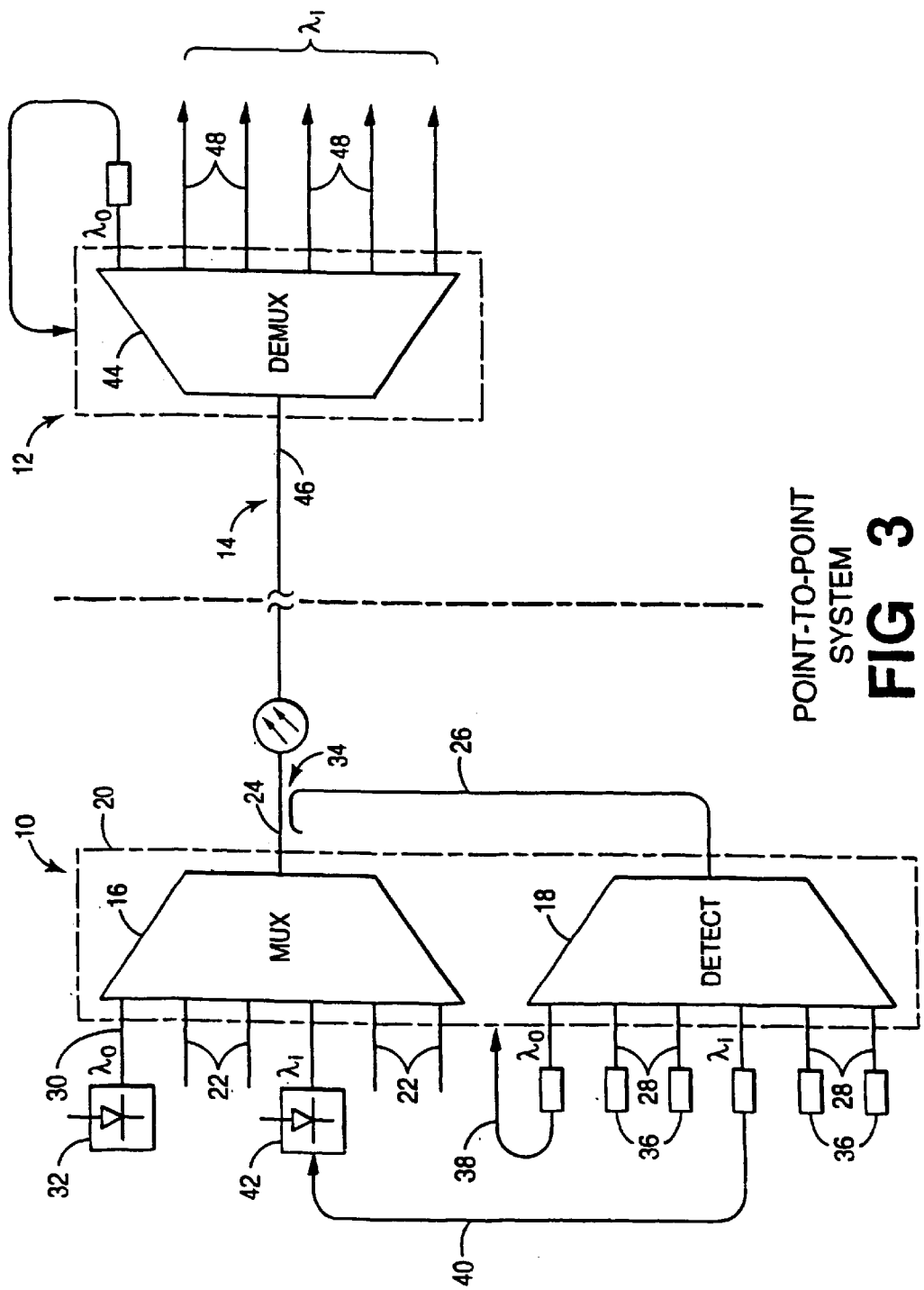
FIG. 3 is a point-to-point communications system employing an embodiment of the present invention.

Now turning to the structural design of one embodiment of the present invention, shown in FIG. 3 is one communications application suitable for employing an embodiment of the present invention. In particular, the illustrated communications application may be described as a "point-to-point" system. In such a system, there is a transmitting unit 10 and a receiving unit 12 that are linked by at least one communication signal path 14, which may be an optical fiber. The transmitting unit 10 includes an optical splitter/combiner device 16 and a detection device 18 which preferably are located on the same substrate 20. As used herein, the term optical splitter/combiner refers to optical devices which are capable of manipulating signals by either splitting them, combining them, or both. In accordance with an embodiment of the present invention, at least one of these optical devices is wavelength selective. As shown, the optical splitter/combiner device 16 is a multiplexer and has a plurality of input channels 22—22 and at least one output channel 24 while the detection device 18 is a demultiplexer and has at least one input channel 26 and a plurality of output channels 28—28.

The plurality of input channels 22—22 of the multiplexer 16 may each carry communication signals of different wavelengths, and likewise, the plurality of outputs 28—28 from the detection device 18 may also carry a number of communication signals each having different wavelengths. As stated earlier, in order to allow the most efficient and effective use of such a communication system, it is critical that the wavelengths on these various channel positions be not only initially aligned with the established wavelength grid, but that the desired alignment between the wavelengths of each of the individual channels relative to the wavelength grid be maintained throughout the operation of the device within the communication system. Once either drifting occurs or fabrication error exists for the channel wavelength in either the splitter/combiner 16 or the transmitter(s), the abilities of the communication system to predictably perform the accurate transfer of signals as desired are significantly lessened.

During operation of the optical interconnection apparatus of the present invention as used within a point-to-point communication systems, a reference signal 30 having a given wavelength, $\lambda_0$, and generated by a reliable optical source 32 such as a wavelength stabilized laser, is input into one of the input ports of the multiplexer 16 of the transmitting unit 10. Preferably, the multiplexer 16 of the transmitting unit 10 is a device with a relatively wide passband, for example in the range of about 0.3 to about 0.7 channel spacing. As used herein, channel spacing may be calculated from either wavelength units such as microns or frequency units such as GHz and refers to the bandwidth at 1 dB from the top of the bandwidth curve as a percentage of the wavelength or frequency unit spacing. For example, in a 100 GHz application, a relatively wide passband would be between about 30 GHz and about 70 GHz at the 1 dB measurement point.

The output channel(s) of the multiplexer 16 of the transmitting unit 10 are then sampled or "tapped-off" by any well known optical sampling device 34, including optical taps, optical couplers, intersecting waveguides, y-branches etc., and carried via signal path 26 to the input of the detection device 18 of the transmitting unit 10. In this regard, the detection device 18 of the transmitting unit 10 provides the ability to monitor a selected wavelength or channel. In accordance with the present invention, the detection device 18 is a wavelength selective device with a relatively narrow passband, for example in the range of about 0.1 to about 0.4 channel spacing. As used herein, a wavelength selective device includes such well known optical filtering devices as wavelength multiplexers, wavelength routers, thin film optical filters, fiber gratings, Fabry-Perot etalons etc.

As a first step in actively aligning the wavelengths of the optical device(s) as desired, the detection device 18 of the transmitting unit 10 filters the sampled portion of reference signal $\lambda_{0WVDM}$ it received and passes this sampled $\lambda_{0WDM}$ through to one of a plurality of detectors 36—36. The output of a detector 36 is connected to one of the components of the transmitting unit 10 so as to establish a feedback link 38. In accordance with the present invention, as the sampled portion of reference signal $\lambda_{0WDM}$ is being monitored, the feedback link 38 is used to manipulate a selected wavelength-affecting characteristic or parameter of at least one component of the transmitting unit 10, such as operating temperature of the substrate 20 securing the multiplexer 16 and the detection device 18, in a manner that adjusts the wavelengths passing therethrough. As a result of this feedback, steps may be taken to adjust the temperature of the substrate in a manner that maximizes the detected power of reference signal $\lambda_{0WDM}$. In other words, by varying the operating temperature of a selected component, the wavelengths passing therethrough are controllably varied thus allowing accurate positioning of the wavelengths $\lambda_{0WDM}, \lambda_{1WDM}, \lambda_{2WDM}, \lambda_{3WDM}, \ldots, \lambda_{nWDM}$.

Throughout the industry, there are a number of well known techniques presently used to adjust the operating temperature of the substrate(s) of various optical devices in order to controllably affect some operational characteristic of the device. These techniques include but are not limited to the most simplistic heating elements as well as newer thermoelectric (TE) coolers. It should be understood that any of these techniques may be used in accordance with the present invention without deviating from the scope or breadth of the present invention. However, for the sake of completeness, one technique generally depicted in FIGS. 3 and 4 simply involves changing the power of a heater element 45 attached to the substrate of the particular optical device of concern. Even though the specific heating technique and/or substrate design used is not critical to the novel aspects of the present invention, merely mounting the substrate(s) on a heating pad with variable temperature controls would be one acceptable design structure.

In accordance with this first aspect of the present invention, the Applicant has recognized that the optical components of the transmitting unit 10 become optimized when sampled $\lambda_{0WDM}$ has been shifted to align with the $\lambda_0$ wavelength of the predefined wavelength grid. Thus, according to a first step of an embodiment of the present invention, a wavelength-affecting parameter of a component, e.g. multiplexer 16, demultiplexer 18 and/or the substrate 20, of the transmitting unit is controllably manipulated to shift sampled $\lambda_{0WDM}$ as needed to align $\lambda_{0WDM}$ with $\lambda_0$ and therefore optimize the reference signal 30 ultimately being output from the transmitting unit 10.

In this regard, there are a number of operating parameters or characteristics of optical devices that are recognized by the industry to affect the wavelength(s) being processed through the device. Included among these are operating temperature, operating current, operating voltage, mechanical strain, etc. While one embodiment of the present invention focuses on the use of temperature to controllably manipulate the wavelength(s) within an optical device to achieve the desired wavelength alignment with the aforementioned grid, it should be understood and appreciated by the reader that other operational parameters and/or characteristics of an optical device may also be employed in accordance with the present invention without deviating from its breadth and/or scope. Likewise, even though power is briefly mentioned above as the particular aspect of $\lambda_{0WDM}$ monitored, any well known monitoring scheme, such as null crossing, tone detection, etc. may also be employed in accordance with the present invention without deviating from its breadth and/or scope. Without going into great detail on the application of any specific monitoring scheme to the present invention, it should be understood and appreciated that the application of such monitoring schemes is believed to be well within the capabilities of one of ordinary skill in the art at hand In a slightly different embodiment of the present invention, at least one additional set of feedback links may also be established either in conjunction with or in lieu of the reference signal $\lambda_{0WDM}$ feedback link discussed above. Most notably, while the first embodiment described above is directed at optimizing the operation of the optical devices of the transmitting unit 10, the embodiment discussed immediately below is directed to providing the ability to individually optimize the operation of each of the wavelengths being generated by the transmitter(s). As before, the present invention achieves this optimization by providing the ability to manipulate the wavelengths of the various transmitter signals so as to align with the wavelengths of the predetermined grid discussed earlier. It should be understood and appreciated that because the channel spacing of such optical devices is generally accurate, when $\lambda_{0WDM}$ is aligned with $\lambda_0$, $\lambda_{1WDM}$ is aligned with $\lambda_1$, $\lambda_{2WDM}$ is aligned with $\lambda_2$, etc. In other words, the entire passband of the optical device can be shifted together.

In particular, this second embodiment of the present invention may include the establishment of a series of feedback links, identified as signal paths 40 in FIG. 3, between a plurality of the output channels 36—36 of the detection demultiplexer 18 and their associated or corresponding input channels 22—22 of the multiplexer 16. In this description, the associated or corresponding input channel 22 from the multiplexer 16 refers to the channel that carried the initially generated signal that the particular detection device output signal was sampled or tapped from. Like described above with reference to the sampled $\lambda_{0WDM}$ signal, once feedback links 40 of this type are established, they may be used to trigger adjustments and/or modifications to a variety of different characteristics or parameters of the transmitter(s) 42 launching optical signals into the transmitting unit 10 of the point-to-point system.

In particular, according to this embodiment of the present invention, each of a series of generated optical signals, identified herein as $\lambda_{1LAS}, \lambda_{2LAS}, \lambda_{3LAS}, \ldots, \lambda_{nLAS}$, may be sampled or "tapped off" and input into the detection device 18 of the transmitting unit 10. The detection device 18 filters the sampled portion of the generated optical signals $\lambda_{1LAS}, \lambda_{2LAS}, \lambda_{3LAS}, \ldots, \lambda_{nLAS}$, received and passes each of these sampled signals through to one of a plurality of detectors 36—36. The output of each detector 36 is connected to one of the components of the transmitting unit 10 so as to establish a series of feedback links which may represent, or be associated with, one of the initially generated signals from the transmitter(s).

As a result of these feedback links, steps may be taken to adjust the operating temperature and/or current of the transmitter 42 generating a particular signal, say $\lambda_{1LAS}$, in a manner that maximizes or optimizes the power of that sampled signal, $\lambda_{1LAS}$. To the extent desired or deemed necessary, any or all of the various optical signals generated by the transmitter(s) 42 may be monitored and manipulated to align with the grid. In this regard, the steps set forth above for $\lambda_{1LAS}$ or $\lambda_{0WDM}$ would simply be repeated for each of the selected signals $\lambda_{1LAS}, \lambda_{2LAS}, \lambda_{3LAS}, \ldots, \lambda_{nLAS}$.

As stated above with regard to the other embodiment of the present invention previously discussed, there are a number of operating parameters or characteristics of optical devices, including laser transmitters, that are recognized by the industry to affect the wavelength(s) being processed through the device. Included among these are operating temperature, operating current, operating voltage, mechanical strain, etc. While this second embodiment of the present invention focuses on the use of current or temperature to controllably manipulate the wavelength(s) generated by the transmitter(s) to achieve the desired alignment with the aforementioned grid, it should be understood and appreciated by the reader that other operational parameters and/or characteristics of an optical device may also be employed in accordance with the present invention without deviating from its breadth and/or scope. Likewise, even though power is the particular aspect of $\lambda_{1LAS}$ monitored in the description above, any well known monitoring scheme, such as null crossing, tone detection, etc. may also be employed in accordance with the present invention without deviating from its breadth and/or scope.

Now turning to the receiving or de-combining unit 12 of the point-to-point application of the present invention, which is also depicted in FIG. 3. In accordance with an embodiment of the present invention, port 0 corresponding to $\lambda_{OWDM}$ of the receiving unit 12 is a wavelength selective device 44 with a relatively narrow passband, for example in the range of about 0.05 to about 0.3 nm. More specifically and as illustrated, the receiving unit 12 includes a wavelength division multiplexer 44 having at least one input channel 46 and a plurality of output channels 48—48.

In order to ensure that the output wavelengths of the wavelength selective device 44 of the receiving unit are properly aligned with the desired wavelength grid referenced earlier, it may be necessary to alter the operation of the filter to shift the wavelengths passed therethrough. Since the wavelength selective device 44 of the receiving unit 12 may be structurally similar to the detection device 18 of the transmitting unit 10 which was described earlier, its specific operational aspects will not be repeated, but instead attention is directed to the description provided earlier with regard to the ability of the present invention to enhance the alignment of the wavelengths of the detection device 18 with the desired grid.

Yet another communications application where the novel aspects of wavelength-channel tracking and alignment is beneficial is optical Add-Drop networks or systems. FIG. 4 illustrates one embodiment of an Add-Drop network employing the active wavelength alignment of the present invention. In particular, the transmitting unit 50 of this Add-Drop network is essentially identical to the transmitting unit 10 described earlier with regard to the point-to-point communication system or application. Therefore, the operational specifics of this section will not be repeated here but instead deference is given to the previously provided verbiage.

However, the remaining system design used to implement the Add-Drop network application of the present invention does introduce a few structural modifications to the devices used and their configuration as compared to the point-to-point system described earlier. In general, there are two units in addition to the transmitting unit described above that are utilized to complete an embodiment of an Add-Drop network application. For the purpose of this disclosure, these two new units will be referred to herein as a channel identification unit, generally depicted as element 60, and a combining unit, generally depicted as element 70.

More specifically, in one embodiment, the channel identification section 60 includes an optical device 62 such as a demultiplexer that can accept at least one input signal and process it in a manner that produces a plurality of varied output signals on different output channels 64—64. Also associated with the demultiplexer 62 is a channel identification device 66 that receives sampled or "tapped off" portions of the signal being input into the demultiplexer 62 and generates a predetermined series of outputs depending on the particular channel recognized as being the channel carrying the sampled signal. There are a number of different ways that the channel identified as carrying the sampled signal can be displayed or utilized.

With regard to the combining unit 70 of the Add-Drop network application, it may be noted from the Figures that this combining unit 70 may be structurally identical to the transmitting units 10 and 50 discussed earlier. In other words and for the sake of illustration, the combining unit 70 includes a multiplexer 72 and a detection device 74 which preferably are located on the same substrate 76. As shown, the multiplexer 72 has a plurality of input channels 78—78 and at least one output channel 80, while the detection device 74 has at least one input channel 82 and a plurality of output channels 84—84. As shown in FIG. 4, the plurality of output channels 64—64 from the demultiplexer 62 of the channel identification section 60 are connected to the plurality of input channels of the multiplexer 72 of the combining unit 70. Also as stated before, the plurality of input channels of the multiplexer 72 may each carry communication signals of different wavelengths, and likewise, the plurality of outputs from the detection device may also carry a number of communication signals each having different wavelengths. Furthermore, for at least the same reasons stated in the discussion on the transmitting units 10 and 50, it is critical to establish and maintain the desired wavelength alignment grid throughout the operation of the optical devices. Once again, deference is given to the previously provided verbiage as to how such optical structures may be monitored and manipulated to achieve the desired wavelength positioning.

Additional components introduced into the Add-Drop network application include 2×2 switches 86—86 on each of the plurality of output channels from the demultiplexer 62 of the channel identification unit 60 which is connected to the plurality of input channels of the multiplexer 72 of the combining unit 70.

Given that at least the high level structural elements of the Add-Drop network application have been described, it is not believed to be necessary to specifically describe the particular operation of each of the components since one of ordinary skill in the art would be able to apply the teachings set forth earlier to an Add-Drop network as shown in light of the discussions already provided herein. Additionally, the particular Add-Drop network shown is merely intended to be exemplary and it should be recognized that the scope of the present invention is believed to cover the use of the novel wavelength-channel tracking and alignment technique described and claimed herein regardless of the exact design of the optical network in which it is employed.

In this regard, the present invention applies the novel aspects of aligning the wavelengths and/or passbands of various optical devices, specifically including multiplexers and transmitters such as lasers, with a predetermined wavelength grid to not only the point-to-point system but also to a fully functional Add-Drop network system.

In closing, the present invention addresses the need to control the variations in wavelength that may occur within optical devices having multiple channels and thus obviate the adverse effects resulting from such wavelengths variations. In particular, the described and claimed invention establishes and utilizes feedback links between certain operating parameters of the optical device and/or certain operating parameters of the associated transmitter(s) to accurately manipulate the wavelengths of these devices in a manner that results in accurate alignment of the different wavelengths being transmitted. More specifically, by utilizing the active alignment or tracking scheme of the present invention, optical systems are able to more effectively operate at smaller channel spacings, i.e. $\leq$ about 50 GHz between adjacent channel positions, and with larger number of channels per device, i.e. $\geq$ about 32 channels.

Figure 1:
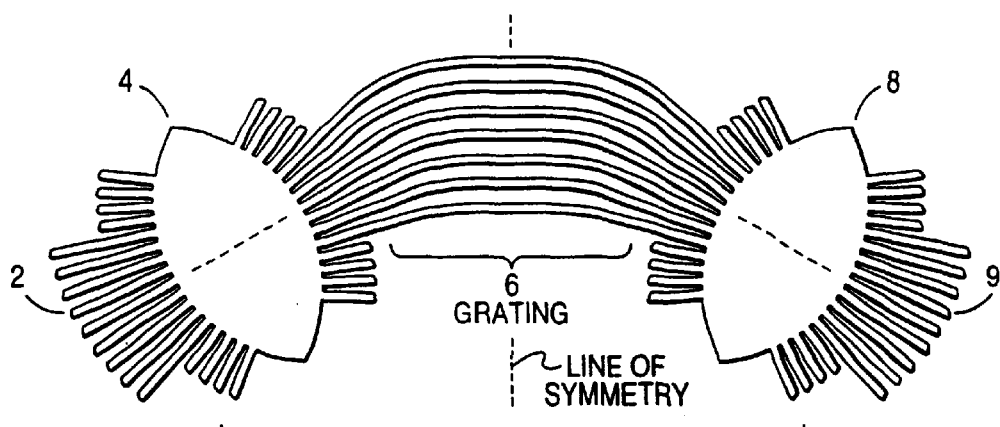
FIG. 1 generally illustrates an example of an optical interconnection apparatus which can be used as an optical switch, multiplexer, or demultiplexer in accordance with the present invention.

It is to be understood that the above-described arrangements are simply illustrative of the invention. Other arrangements may be devised by those skilled in the art which will embody the principles of the invention and fall within the spirit and scope thereof. Specifically, it is noted that the particular manner in which the individual optical components are separated onto different substrates is a matter of design choice and not the crux of the present invention. In other words, whether each optical component is secured to its own substrate or one substrate hold all of the optical components or some combination in between, the novel attributes of the present invention equally apply. Furthermore, even though the particular optical arrangement set forth in FIG. 1 is a waveguide grating router, it should be fully understood and appreciated that other optical arrangements, such as cascaded Mach-Zehnder interferometers, fiber gratings, thin film filters, etc. may also be used in accordance with the present invention.

What is claimed is:

1. An optical apparatus comprising:
    an optical splitter/combiner device which includes at least one input channel which receives optical signals into the optical apparatus, and at least one output;
    a tap for diverting some portion of the optical signals propagating from an output of the splitter/combiner;
    a detecting device which includes a wavelength selective device having at least one channel which receives the tapped or diverted signal portion(s) from the splitter/combiner, and at least one output;
    a detector connected to at least one output of the detecting device for evaluating at least one selected characteristic of an optical signal on a predetermined channel;
    a feedback link between the detector and a control mechanism which is capable of controllably affecting the selected characteristic of at least one of the optical signals received into the optical apparatus; and
    a feedback link between the detector and a control mechanism which is capable of controllably affecting passbands of a plurality of channels of the splitter/combiner device.

2. The optical apparatus of claim 1 wherein the wavelength selective device of the detecting device is selected from the group consisting of a single output filter and a wave division multiplexer.

3. The optical apparatus of claim 1 wherein the splitter/combiner includes an optical multiplexer having a relatively wide passband and the detecting device includes an optical demultiplexer having a relatively narrow passband.

4. The optical apparatus of claim 1 further comprising an input reference channel which carries a reference optical signal of a defined wavelength into the optical apparatus from an optical signal transmission source.

5. The optical apparatus of claim 4 wherein a portion of the reference optical signal on the input reference channel is diverted to the detecting device.

6. The optical apparatus of claim 5 wherein the control mechanism is activated via a feedback link from the detector to the optical/splitter device so as to increase the power of the optical reference signal.

7. The optical apparatus of claim 1 wherein the number of input channels of the splitter/combiner is equal to the number of output channels from the detecting device of the apparatus.

8. The optical apparatus of claim 7 further comprising a feedback link connecting each of the output channels from the detecting device to a corresponding receiving/input channel of the splitter/combiner of the apparatus.

9. The optical apparatus of claim 8 wherein the control mechanism is activated so as to shift the wavelength of at least one of the optical signals received by the splitter/combiner in a maimer that aligns it with a predetermined wavelength value.

10. The optical apparatus of claim 8 wherein the mechanism capable of controllably affecting the selected optical signal characteristic is activated so as to shift the wavelengths of each of the optical signals received by the splitter/combiner in a manner that aligns them with a predetermined series of wavelengths.

11. The optical apparatus of claim 1 wherein the selected characteristic of the optical signal tapped and diverted to be evaluated is selected from the group consisting of wavelength, power, and phase.

12. An optical apparatus comprising:
    an optical splitter/combiner device which includes at least one input channel which receives optical signals into the optical apparatus, and at least one output;
    a tap for diverting some portion of the optical signals propagating from an output of the splitter/combiner;
    a detecting device which includes a wavelength selective device having at least one channel which receives the tapped or diverted signal portion(s) from the splitter/combiner, and at least one output;
    a detector connected to at least one output of the detecting device for evaluating at least one selected characteristic of an optical signal on a predetermined channel; and
    a feedback link between the detector and a control mechanism which is capable of controllably affecting the selected characteristic of at least one of the optical signals received into the optical apparatus; and
    an input reference channel which carries a reference optical signal of a defined wavelength into the optical apparatus from an optical signal transmission source,
    wherein the wavelength selective device of the detecting device is selected from the group consisting of a single output filter and a wave division multiplexer; and
    wherein the splitter/combiner includes an optical multiplexer having a relatively wide passband and the detecting device includes an optical demultiplexer having a relatively narrow passband; and
    wherein a portion of the reference optical signal on the input reference channel is diverted to the detecting device; and
    wherein the mechanism capable of controllably affecting the selected optical signal characteristic is activated via a feedback link from the detecting device to the optical/splitter device so as to shift the wavelength of the reference signal in a manner that aligns it with a predetermined reference wavelength.

13. An optical apparatus which has an operating temperature that affects the various wavelengths of the optical signals within the apparatus comprising:
    an optical splitter/combiner device which includes at least one input channel which receives optical signals into the optical apparatus, and at least one output;
    a tap for diverting some portion of the optical signals propagating from an output of the splitter/combiner;
    a detecting device of the optical apparatus which includes at least one channel which receives the tapped or diverted signal portion(s) from an output of the splitter/combiner, and at least one output;
    a detector on at least one output of the detecting device of the apparatus for evaluating at least one selected characteristic of an optical signal on that channel; and
    a feedback link between the detector and a control mechanism which is capable of controllably affecting passbands of a plurality of channels of the splitter/combiner device.

14. A point-to-point optical system that comprises:
1) a transmitting unit that comprises
an optical splitter/combiner device which includes at least one input channel which receives optical signals into the optical apparatus, and at least one output;
a tap for diverting at least some portion of the optical signals propagating from an output of the splitter/combiner;
a detecting device which includes a wavelength selective device having at least one channel which receives the tapped or diverted signal portions from the splitter/combiner, and at least one output;
a detector connected to at least one output of the detecting device for evaluating at least one selected characteristic of an optical signal on a predetermined channel;
a feedback link between the detector and a mechanism which is capable of controllably affecting the selected characteristic of at least one of the optical signals received into the optical apparatus; and
a feedback link between the detector and a control mechanism which is capable of controllably affecting passbands of a plurality of channels of the splitter/combiner device; and
2) a receiving unit for filtering the optical signal output from the transmitting unit.

15. The point-to-point optical system of claim 14 wherein the receiving unit comprises an optical demultiplexer having a relatively narrow passband.

16. A point-to-point optical system that comprises:
1) a transmitting unit that comprises
an optical splitter/combiner device which includes at least one input channel which receives optical signals into the optical apparatus, and at least one output;
a tap for diverting at least some portion of the optical signals propagating from an output of the splitter/combiner;
a detecting device which includes a wavelength selective device having at least one channel which receives the tapped or diverted signal portions from the splitter/combiner, and at least one output;
a detector connected to at least one output of the detecting device for evaluating at least one selected characteristic of an optical signal on a predetermined channel; and
a feedback link between the detector and a mechanism which is capable of controllably affecting the selected characteristic of at least one of the optical signals received into the optical apparatus; and
2) a receiving unit for filtering the optical signal output from the transmitting unit; and
wherein the receiving unit comprises an optical demultiplexer having a relatively narrow passband; and
wherein the passband of the optical demultiplexer of the receiving unit may also be controllably shifted in a manner to align it with a predetermined wavelength grid.

17. An Add-Drop optical system that comprises:
1) a transmitting unit that comprises:
an optical splitter/combiner device which includes at least one input channel which receives optical signals into the optical apparatus, and at least one output;
a tap for diverting at least some portion of the optical signals propagating from an output of the splitter/combiner;
a detecting device which includes a wavelength selective device having at one channel which receives the tapped or diverted signal portions from the splitter/combiner, and at least one output;
a detector connected to at least one output of the detecting device for evaluating at least one selected characteristic of an optical signal on a predetermined channel; and
a feedback link between the detector and a mechanism which is capable of controllably affecting the selected characteristic of at least one of the optical signals received into the optical apparatus;
2) a channel identification unit which has a plurality of output channels and provides information regarding a given optical signal on a selected channel;
3) a combining unit which has a plurality of input channels connected to the plurality of output channels from the channel identification unit; and
4) an optical switch on at least one of the channels between the channel identification unit and the combining unit which is capable of allowing optical signals to be added to or dropped from a selected channel.

18. The Add-Drop optical system of claim 17 wherein the passband of the channel identification unit may also be controllably shifted in a manner to align it with a predetermined wavelength grid.

19. The Add-Drop optical system of claim 17 wherein the combining unit provides the same operational features as the transmitting unit.

20. An optical apparatus comprising at least one feedback mechanism to align the passband of at least one wavelength division multiplexer within the optical apparatus to a predetermined wavelength grid and a second feedback mechanism to align at least one wavelength being generated by a source associated with the optical apparatus to a selected point on a predetermined wavelength grid.

21. A method of transmitting optical signals comprising the steps of:
receiving optical signals into an optical device which includes a splitter/combiner that has at least one input channel and at least one output;
diverting at least some portion of the optical signals propagating from an output of the splitter/combiner to a detecting device;
detecting the diverted signal portions from the splitter/combiner with the detecting device;
evaluating at least one selected characteristic about the optical signal; and
controllably affecting passbands of a plurality of channels of the splitter/combiner.

* * * * *